United States Patent [19]

Arai

[11] 3,971,055

[45] July 20, 1976

[54] ANALOG MEMORY CIRCUIT UTILIZING A FIELD EFFECT TRANSISTOR FOR SIGNAL STORAGE

[75] Inventor: Michio Arai, Tokyo, Japan

[73] Assignee: Sony Corporation, Tokyo, Japan

[22] Filed: Aug. 21, 1974

[21] Appl. No.: 499,220

Related U.S. Application Data

[63] Continuation-in-part of Ser. No. 373,731, June 26, 1973, Pat. No. 3,868,718.

[30] Foreign Application Priority Data

Aug. 25, 1973 Japan.............................. 48-95391

[52] U.S. Cl................................. 357/22; 357/38; 307/304; 340/173 CA
[51] Int. Cl.²......................................... H01L 29/80
[58] Field of Search.................... 357/22, 23, 38; 307/304, 300; 340/173

[56] References Cited
UNITED STATES PATENTS

| | | | |
|---|---|---|---|
| 3,443,172 | 5/1969 | Koepp................................ | 357/22 |
| 3,538,399 | 11/1970 | Bresee et al. ......................... | 357/22 |
| 3,578,514 | 5/1971 | Lesk ..................................... | 357/22 |
| 3,663,873 | 5/1972 | Yagi..................................... | 357/22 |
| 3,740,689 | 6/1973 | Yamashita ............................ | 357/22 |

OTHER PUBLICATIONS

A Proposed Vertical Channel Veriable Resistance Fet; Proceedings IEEE, vol. 59, No. 5 May 1971.
IBM Technical Disclosure Bulletin, vol. 14, No. 1 June 1971.

*Primary Examiner*—Andrew J. James
*Attorney, Agent, or Firm*—Hill, Gross, Simpson, Van Santen, Steadman, Chiara & Simpson

[57] ABSTRACT

An analog memory circuit using a field effect transistor having a semiconductive substrate, first and second semiconductive regions forming a PN junction therebetween, the first region being capacitively coupled to the current path portion to form a capacitor, and a control electrode connected to the second region. The analog memory circuit stores a signal in the capacitor between the first region and the current path portion.

8 Claims, 14 Drawing Figures

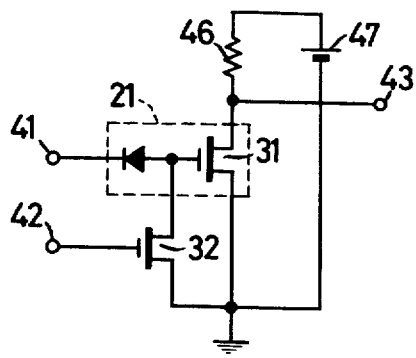
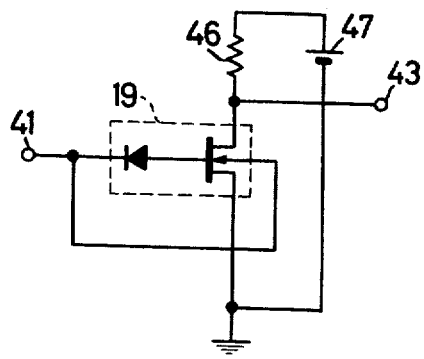
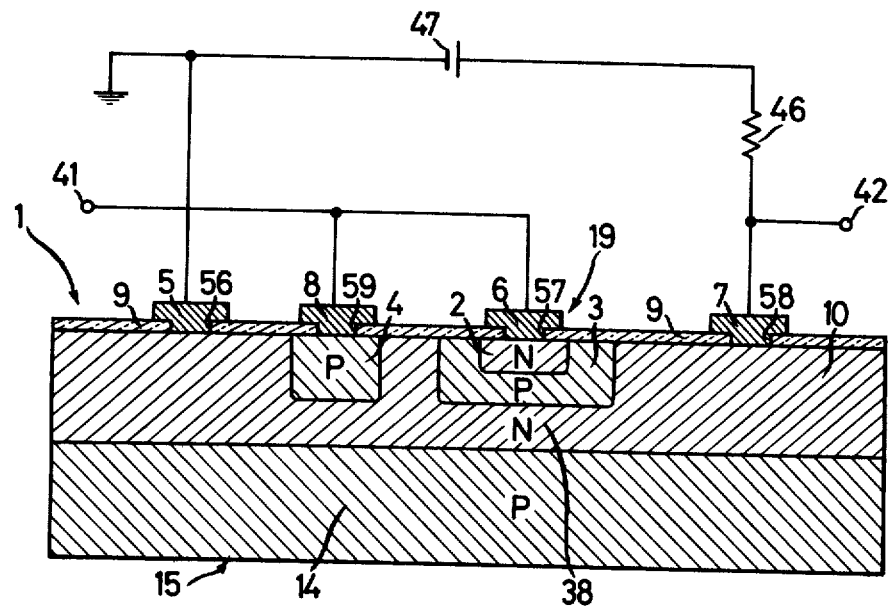

3,971,055

ANALOG MEMORY CIRCUIT UTILIZING A FIELD EFFECT TRANSISTOR FOR SIGNAL STORAGE

CROSS-REFERENCES TO RELATED APPLICATIONS

This application is a continuation-in-part application of my copending application Ser. No. 373,731, filed June 26, 1973. now U.S. Pat. No. 3,868,718 which issued on Feb. 25, 1975.

BACKGROUND OF THE INVENTION

1. Field of the Invention

This invention relates to an analog memory circuit storing an analog signal for a suitable time.

2. Description of the Prior Art

In the conventional analog memory circuit, a special memory capacitor is required for storage of an analog signal. Therefore, it is difficult to form an integrated circuit for analog memory.

SUMMARY OF THE INVENTION

An object of this invention is to provide a readily integrable analog memory circuit requiring no special memory capacitor which is simple in construction.

Another object of this invention is to provide an analog memory circuit in which the memory time can be freely varied.

A further object of this invention is to provide an analog memory circuit in which an output signal is less distorted.

A still further object of this invention is to provide an analog memory circuit using a novel semiconductor device.

In accordance with an aspect of this invention, an analog memory circuit comprises:
a. a semiconductor device including a semiconductive substrate having a current path portion, first and second semiconductive regions forming a PN junction therebetween, said first region being coupled through a capacitor to said current path portion, and a control electrode connected to said second region,
b. means for applying a current to said current path portion,
c. means for removing an electric charge from said capacitor, and
d. means for applying a signal to said control electrode.

The above, and other objects, features and advantages of the invention, will be apparent in the following detailed description of illustrative embodiments thereof which is to be read in connection with the accompanying drawings.

BRIEF DESCRIPTION OF THE DRAWINGS

FIG. 5 is a circuit representation of the semiconductor device of FIG. 4;

FIG. 8 is a circuit representation of the semiconductor device of FIG. 7;

FIG. 9 is a schematic cross-sectional view of a semiconductor device for an analog memory circuit according to a still further embodiment of this invention; and FIG. 10 is a circuit representation of the semiconductor device of FIG. 9.

DESCRIPTION OF THE PREFERRED EMBODIMENTS

One embodiment of this invention will be described with reference to FIG. 1–FIG. 3D.

Figure 1:
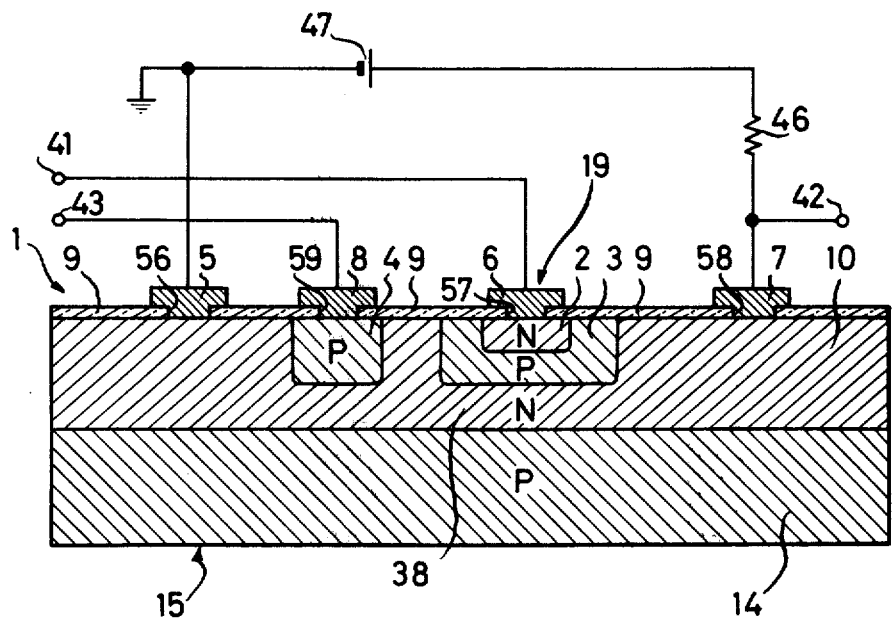
FIG. 1 is a schematic cross-sectional view of a semiconductor device for an analog memory circuit according to one embodiment of this invention.

In FIG. 1, a semiconductor device 1 comprises a charge storage junction type field effect transistor 19 (hereafter called CSJ FET). An N-type semiconductive region 10 is deposited on a P-type semiconductive region 14 as a semiconductive substrate 15 by the epitaxial growth method. A P-type semiconductive region 3 as a gate region is formed in the N-type semiconductive region 10 by the diffusion method.

The conventional lateral junction type field effect transistor is formed as above mentioned. In the semiconductor device 1, an N-type semiconductive region 2 is formed in the P-type semiconductive region 3 by the diffusion method. A PN junction is formed between the P-type semiconductive region 3 and the N-type semiconductive region 2. A P-type semiconductive region 4 is formed in the N-type semiconductive region 10 by the diffusion method. The P-type semiconductive region 4 functions as an emitter region for injecting carriers.

An insulating layer 9 made of $SiO_2$ is deposited on the N-type semiconductive region 10. Openings 56, 57 and 58 made in the insulating layer 9 are closed by a source electrode 5, a gate electrode 6 and a drain electrode 7, respectively. Moreover, an opening 59 made in the insulating layer 9 is closed by an emitter electrode 8.

The source electrode 5 is connected directly to the ground and the gate electrode 6 is connected to a PAM (Pulse Amplitude Modulated)-signal input terminal 41 to which a PAM-signal is applied.

The drain electrode 7 is connected to the ground through a resistor 46 and a DC power source 47 whose negative terminal is connected to the ground. The emitter electrode 8 is connected to a blanking pulse input terminal 43. An output terminal 42 is connected to a connecting point of the drain electrode 7 and the resistor 46.

Figure 2:
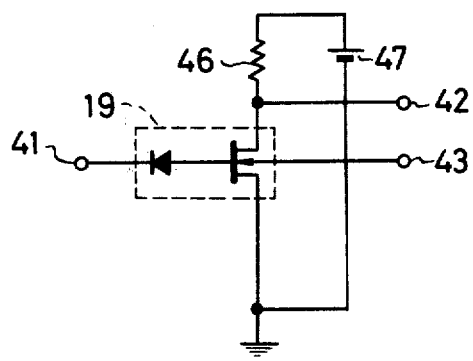
FIG. 2 is a circuit representation of the semiconductor device of FIG. 1.
Figure 3:
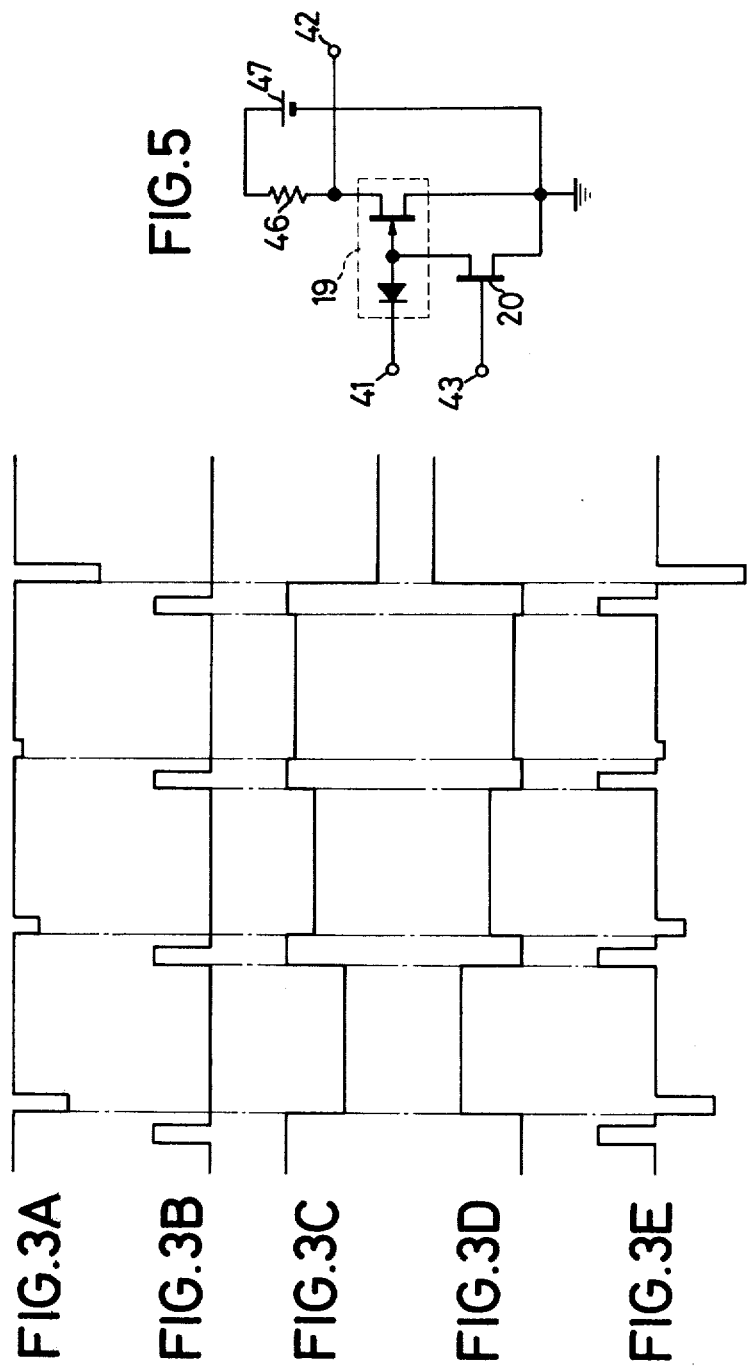
FIG. 3A is a waveform diagram depicting a PAM-signal applied to a PAM-signal input terminal of the semiconductor device of FIG. 1.
FIG. 3B is a waveform diagram depicting a blanking pulse applied to a blanking pulse input terminal of the semiconductor device of FIG. 1.
FIG. 3C is a waveform diagram depicting a drain current of the semiconductor device of FIG. 1.
FIG. 3D is a waveform diagram depicting a source-drain voltage of the semiconductor device of FIG. 1.
FIG. 3E is a waveform diagram depicting a composite signal consisting of the PAM-signal and the blanking pulse, applied to a common input terminal of a semiconductor device of FIG. 9.

FIG. 2 is a circuit representation of the semiconductor device 1 shown on FIG. 1 which forms an analog memory circuit. Parts in FIG. 2 which correspond with the parts of the one embodiment of FIG. 1, are denoted by the same reference numerals, which will not be described in detail.

Next, operations of the semiconductor device 1 shown on FIG. 1 and FIG. 2 will be described with reference to FIG. 3A–FIG. 3D.

A PAM-signal as shown on FIG. 3A is applied to the PAM-signal input terminal 41, while a blanking pulse as shown on FIG. 3B is applied to the blanking pulse input terminal 43.

When the negative pulse as shown on FIG. 3A is applied to the gate electrode 6, the PN junction between the N-type semiconductive region 2 and the P-type semiconductive region 3 is forward-biased, and the PN junction between the P-type semiconductive region 3 and the N-type semiconductive region 10 is reverse-biased. Accordingly, the whole of the voltage of the negative pulse is applied across the PN junction between the P-type semiconductive region 3 and the N-type semiconductive region 10, so that a depletion layer is spread adjacent to the PN junction between the P-type semiconductive region 3 and the N-type semiconductive region 10. With the spread of the depletion layer, a lateral channel 38 extending from the source electrode 5 to the drain electrode 7 is narrowed and so a resistance between the source electrode 5 and the drain electrode 7 is increased. The operation of the conventional junction field effect transistor (hereafter called J-FET) is substantially the same as the abovementioned.

With the application of the negative pulse to the gate electrode 6, negative charge in proportion to the amplitude of the negative pulse is stored in the P-type semiconductive region 3. Since the N-type semiconductive region 2 is formed between the P-type semiconductive region 3 and the gate electrode 6, the negative charge is prevented from recombining and so it is perfectly stored in the P-type semiconductive region 3. Thus, the analog value of the analog signal is memorized. Due to such a charge storage effect, an analog memory circuit according to this invention does not require a special memory capacitor for a charge storage, differently from the conventional analog memory circuit.

The negative charge remains stored in the P-type semiconductive region 3, until carriers or holes are injected from the P-type semiconductive region 4 with the application of the blanking pulse (FIG. 3B) to the emitter electrode 8. The holes are injected from the P-type semiconductive region 4 into the N-type semiconductive region 10. The holes reach the depletion layer formed due to the electrical field which is generated by the negative charge stored in the P-type semiconductive region 3, so that the negative charge is neutralized or blanked in the P-type semiconductive region 3. As soon as the negative charge is neutralized in the P-type semiconductive region 3, the next PAM-signal is applied to the gate electrode 6. The corresponding negative charge is stored in the P-type semiconductive region 3. As above mentioned, the analog value of the analog signal is memorized.

Accordingly, a drain current as shown on FIG. 3C flows in the CSJ FET 19 and analog signal memorizing the analog value as shown on FIG. 3D is generated at the output terminal 42 connected to the drain electrode 7.

In the above embodiment, the negative charge stored in the P-type semiconductive region 3 is neutralized with the injection of the holes as the minority carriers from the P-type semiconductive region 4 as the emitter. It may be neutralized with the irradiation of light, instead of the injection of the carriers. The PN junction between the P-type semiconductive region 3 as the gate region and the N-type semiconductive region 10, is reverse-biased with the negative charge stored in the P-type semiconductive region 3. When light is irradiated onto the upper surface of the semiconductor device 1, carriers (electrons and holes) are generated in a transition region, namely the depletion layer to increase reverse currents, so that the negative charge stored in the P-type semiconductive region 3 is neutralized or blanked. Thus, the analog signal memorizing the analog value as shown on FIG. 3D can be obtained.

Next, another embodiment of this invention will be described with reference to FIG. 4 and FIG. 5.

In this embodiment, a discharging path is provided for neutralizing the negative charge stored in the gate region of the CSJ FET, instead of the emitter electrode for injecting the carriers. Parts in FIG. 4 and FIG. 5 which correspond with the parts in FIG. 1 and FIG. 2, are denoted by the same reference numerals, which will not be described in detail.

Figure 4:
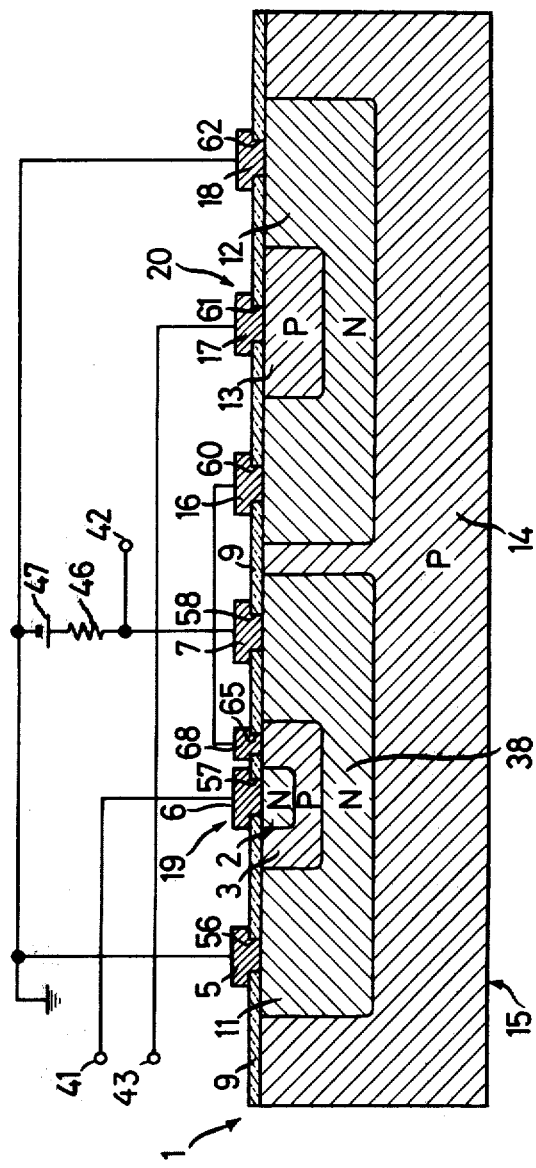
FIG. 4 is a schematic cross-sectional view of a semiconductor device for an analog memory circuit according to another embodiment of this invention.

In the semiconductor device 1 shown on FIG. 4, island-like N-type semiconductive regions 11 and 12 are formed in the P-type semiconductive region 14 as the semiconductive substrate 15 by the diffusion method. Moreover, the P-type semiconductive region 3 and another P-type semiconductive region 13 are formed in the N-type semiconductive regions 11 and 12, respectively by the diffusion method. The N-type semiconductive region 2 is formed in the P-type semiconductive region 3 by the diffusion method. The insulating layer 9 made of $SiO_2$ is deposited on the upper surface of the P-type semiconductive region 14. The openings 56, 57 and 58 made in the insulating layer 9 are closed by the source electrode 5, the gate electrode 6 and the drain electrode 7, respectively. Moreover, openings 60, 61 and 62 made in the insulating layer 9 are closed by a drain electrode 16, a gate electrode 17 and a source electrode 18, respectively. And, an opening 65 made in the insulating layer 9 and facing to the P-type semiconductive region 3 is closed by an electrode 68 for discharging the stored charge. Thus, the CSJ FET 19 is formed in the N-type semiconductive region 11, while a J-FET 20 is formed in the N-type semiconductive region 12.

In the CSJ FET 19 of the semiconductor device 1 shown on FIG. 4, the source electrode 5 is connected directly to the ground, the gate electrode 6 is connected to the PAM-signal input terminal 41, and the drain electrode 7 is connected to the ground through the resistor 46 and the DC power source 47 whose negative terminal is connected to the ground.

In the J-FET 20, the drain electrode 16 is connected to the electrode 68 for discharging the stored charge, formed on the P-type semiconductive region 3 of the CSJ FET 19, the gate electrode 17 is connected to the blanking pulse input terminal 43, and the source electrode 18 is connected directly to the ground. Moreover, the output terminal 42 is connected to the connecting point of the drain electrode 7 and the resistor 46.

FIG. 5 is a circuit representation of the semiconductor device shown on FIG. 4 which forms an analog memory circuit. Parts in FIG. 5 which correspond with the parts in FIG. 4, are denoted by the same reference numerals, which will not be described in detail.

Next, operations of the semiconductor device 1 shown on FIG. 4 and FIG. 5 will be described. Since the semiconductor device 1 shown on FIG. 4 is equal substantially to the semiconductor device 1 shown on FIG. 1, except that the J-FET 20 as the discharging path is provided for neutralizing the negative charge stored in the gate region of the CSJ FET 19, only an operation for neutralizing the stored charge will be described. The positive blanking pulse (FIG. 3B) is applied to the gate electrode 17 of the J-FET 20 through the blanking pulse input terminal 43, so that the source-drain of the J-FET 20 is put into the ON-state. Accordingly, the charge stored in the P-type semiconductive region 3 of the CSJ FET 19 is discharged through the electrode 68 and the source-drain of the J-FET 20. Thus, the stored charge is blanked and the analog signal (FIG. 3D) memorizing the analog value can be obtained.

Next, a still another embodiment of this invention will be described with reference to FIG. 6.

In this embodiment, such a PN junction as formed in the gate region of the CSJ FET of the semiconductor device of FIG. 1, is separately formed at another position in the same substrate. Parts in FIG. 6 which correspond with the parts in FIG. 1, are denoted by the same reference numerals, which will not be described in detail.

Figure 6:
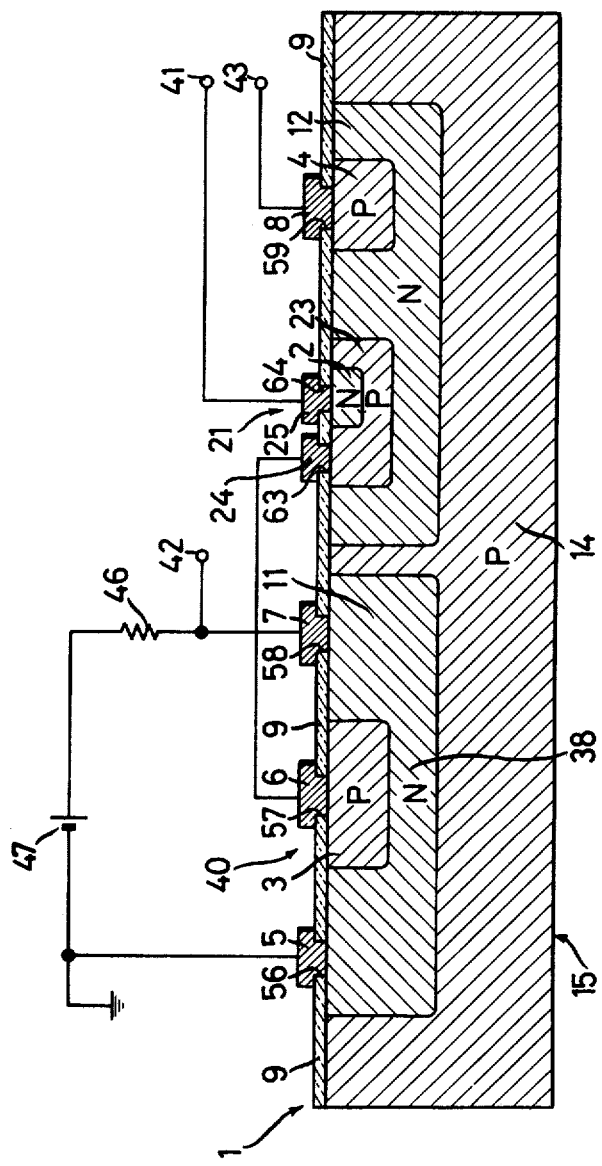
FIG. 6 is a schematic cross-sectional view of a semiconductor device for an analog memory circuit according to a still another embodiment of this invention.

In the semiconductor device 1 shown on FIG. 6, the island-like N-type semiconductive regions 11 and 12 are formed in the P-type semiconductive region 14 by the diffusion method. Moreover, the P-type semiconductive regions 3 and 4, and another P-type semiconductive region 23 are formed in the N-type semiconductive regions 11 and 12, respectively by the diffusion method. The N-type semiconductive region 2 is formed in the P-type semiconductive region 23 by the diffusion method. The insulating layer 9 made of SiO$_2$ is deposited on the upper surface of the P-type semiconductive region 14. The openings 56, 57 and 58 made in the insulating layer 9 are closed by the source electrode 5, the gate electrode 6 and the drain electrode 7, respectively. Moreover, openings 63, 64 and 59 made in the insulating layer 9 are closed by an anode electrode 24, a cathode electrode 25 and the emitter electrode 8, respectively.

A J-FET 40 is formed in the N-type semiconductive region 11. A diode 21 and the P-type semiconductive region 4 are formed in the N-type semiconductive region 12. The P-type semiconductive region 4 functions as an emitter for injecting carriers which neutralize the charge stored in the P-type semiconductive region 23 of the diode 21. The gate electrode 6 of the J-FET 40 is connected to the anode electrode 24 of the diode 21. Accordingly, this semiconductor device 1 operates in the same manner as the afore-mentioned CSJ FET. Since the charge stored in the P-type semiconductive region 23 of the diode 21 is neutralized with the injection of the carriers from the P-type semiconductive region 4, this semiconductor device 1 operates in the same manner as the one embodiment of FIG. 1.

In the J-FET 40 of the semiconductor device 1 of FIG. 6, the source electrode 5 is connected directly to the ground, the gate electrode 6 is connected to the anode electrode 24 of the diode 21, and the drain electrode 7 is connected to the ground through the resistor 46 and the DC power source 47 whose negative terminal is connected to the ground. The cathode electrode 25 of the diode 21 is connected to the PAM-signal input terminal 41. The emitter electrode 8 is connected to the blanking pulse input terminal 43. The output terminal 42 is connected to the connecting point of the drain electrode 7 and the resistor 46.

The circuit representation of the semiconductor device 1 of FIG. 6 is the same as that (FIG. 2) of the semiconductor device 1 of FIG. 1 which forms the analog memory circuit. Accordingly, operations of the semiconductor device 1 of FIG. 6 will be described with reference to FIG. 2.

This semiconductor device 1 is substantially the same as the semiconductor device of FIG. 1, except that the PN junction as formed in the gate region of the CSJ FET 19 of the semiconductor device 1 of FIG. 1 is separately formed at the other position in the same semiconductive substrate. Accordingly, it will be described that the semiconductor device 1 of FIG. 6 has the same charge storage effect as the CSJ FET 19 of FIG. 1 although the PN-junction as formed in the gate region of the CSJ FET 19 is separately formed at the other position in the same semiconductive substrate.

When the negative pulse is applied to the cathode electrode 25 of the diode 21, the PN junction between the N-type semiconductive region 2 and the P-type semiconductive region 23 is forward-biased, and the PN junction between the P-type semiconductive region 3 and the N-type semiconductive region 11 is reverse-biased. Accordingly, the whole of the voltage of the negative pulse is applied across the PN junction between the P-type semiconductive region 3 and the N-type semiconductive region 11, so that a depletion layer is spread adjacent to the PN junction between the P-type semiconductive region 3 and the N-type semiconductive region 11. With the spread of the depletion layer, a lateral channel 38 extending from the source electrode 5 to the drain electrode 7 is narrowed and so a resistance between the source electrode 5 and the drain electrode 7 is increased.

With the application of the negative pulse to the cathode electrode 25, negative charge in proportion to the amplitude of the negative pulse is stored in the P-type semiconductive regions 3 and 23. Since the N-type semiconductive region 2 is formed between the P-type semiconductive region 23 and the cathode electrode 25, the negative charge is prevented from recombining and so it is perfectly stored in the P-type semiconductive regions 3 and 23. Accordingly, the semiconductor device 1 of FIG. 6 functions substantially in the same manner as the CSJ FET 19 of FIG. 1. The stored charge is neutralized with the application of the blanking pulse to the emitter electrode 8, as in the semiconductor device of FIG. 1. With the application of the positive pulse as the blanking pulse to the emitter electrode 8, the carriers or the holes are injected from the P-type semiconductive region 4 to neutralize the negative charge stored in the one P-type semiconductive regions 23 and the other P-type semiconductive region 3 connected to the one P-type semiconductive region 23 through the conductor. Thus, the negative charge is blanked.

In the embodiment of FIG. 6, the negative charge stored in the P-type semiconductor regions 3 and 23 is neutralized with the injection of the holes as the minority carriers from the P-type semiconductive region 4 as the emitter region for injecting the carriers. However, it may be neutralized with the irradiation of light, as in the embodiment of FIG. 1.

Next, a further embodiment of this invention will be described with reference to FIG. 7 and FIG. 8.

This embodiment is substantially the same as the embodiment of FIG. 4, except that the CSJ FET is converted to a charge storage MOS FET and that the J-FET as the discharging path for the stored charge is converted to another MOS FET. Parts in FIG. 7 which correspond with the parts in FIG. 4, are denoted by the same reference numerals, which will not be described in detail.

The N-type semiconductive region 30 as the drain region and the N-type semiconductive region 29 as the source region are formed in the P-type semiconductive region 14. The gate electrode 27 is formed on the insulating layer 9. Openings 56 and 58 made in the insulating layer 9 are closed by the source electrode 26 and the drain electrode 28. Thus, the MOS FET 31 is formed in the P-type semiconductive substrate 15.

The N-type semiconductive region 2 is formed in the P-type semiconductive region 14. The P-type semiconductive region 23 is formed in the N-type semiconductive region 2. Openings 63 and 64 made in the insulating layer 9 are closed by the cathode electrodes 25 and the anode electrode 24, respectively. Thus, the diode 21 is formed in the semiconductive substrate 15.

The gate electrode 27 of the MOS FET 31 is connected to the anode electrode 24 of the diode 21. Thus, the charge storage MOS FET consisting of the MOS FET 31 and the diode 21 is formed in the semiconductive substrate 15.

An N-type semiconductive region 33 as a drain region and another N-type semiconductive region 34 as a source region are formed in the P-type semiconductive region 14. A gate electrode 36 is formed on the insulating layer 9. Openings 60 and 62 made in the insulating layer 9 are closed by a drain electrode 35 and a source electrode 37, respectively. Thus, the MOS FET 32 is formed in the semiconductive substate 15. Moreover, the drain electrode 35 of the MOS FET 32 is connected to the anode electrode 24 of the diode 21.

Figure 7:
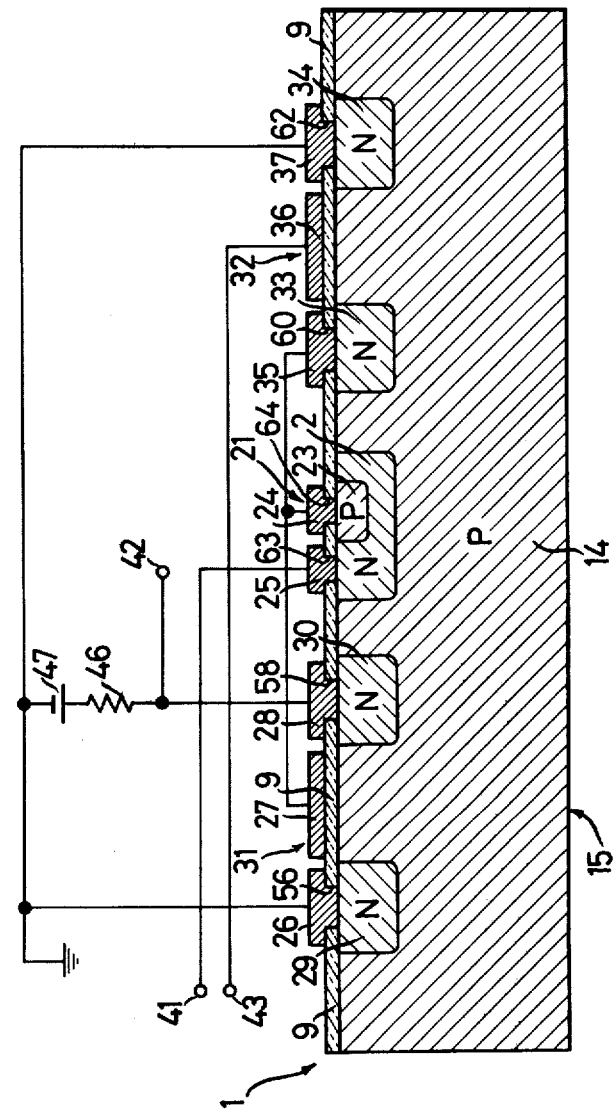
FIG. 7 is a schematic cross-sectional view of a semiconductor device for an analog memory circuit according to a further embodiment of this invention.

The embodiment of FIG. 7 is substantially the same as that of FIG. 4, except that the CSJ FET 19 and the J-FET 20 are converted to the charge storage MOS FET consisting of the MOS FET 31 and the diode 21, and the MOS FET 32, respectively.

FIG. 8 is a circuit representation of the semiconductor device shown on FIG. 7 which forms an analog memory circuit. Parts in FIG. 8 which correspond with the parts in FIG. 7, are denoted by the same reference numerals, which will not be described in detail.

Next, operations of the semiconductor device 1 shown on FIG. 7 and FIG. 8 will be described only with respect to the points different from the semiconductor device of FIG. 4.

When the PAM-signal is applied to the cathode electrode 25 of the diode 21, the PN-junction between the N-type semiconductive region 2 and the P-type semiconductive region 23 is forward-biased. Accordingly, the whole of the voltage of the negative pulse as the PAM-signal is applied to the gate electrode 27 of the MOS FET 31 through the anode electrode 24. The channel resistance between the N-type semiconductive region 29 and the N-type semiconductive region 30 is controlled by the charge induced under the gate electrode 27 through the insulating layer 9. The charge in proportion to the amplitude of the negative pulse is stored in the P-type semiconductive region 23. Since the N-type semiconductive region 2 is formed between the P-type semiconductive region 23 and the cathode electrode 25, the negative charge is prevented from recombining and it is perfectly stored, in the P-type semiconductive region 23. The stored charge is discharged through the source-drain of the MOS FET 32. The positive blanking pulse as shown on FIG. 3B is applied to the gate electrode 36 of the MOS FET 32 through the blanking pulse input terminal 43. The source-drain of the MOS FET 32 is put into the ON-state by the blanking pulse, so that the charge stored in the P-type semiconductive region 23 of the diode 21 is discharged through the source-drain of the MOS FET 32. Thus, the stored charge is blanked. Also in the case of the blanking of the stored charge by the discharging, the analog signal (FIG. 3D) memorizing the analog value can be obtained.

Moreover, the stored charge in the semiconductor device employing the charge storage MOS FET of FIG. 7 may be blanked with the irradiation of light or the injection of the carriers from the emitter region.

As above mentioned, different methods may be used for the blanking of the stored charge in the analog memory circuit comprising the CSJ FET or the charge storage MOS FET, in order to obtain substantially the same characteristics as the above-mentioned analog memory circuits.

In the above-mentioned analog memory circuits using the CSJ FET or the charge storage MOS FET, the PAM-signal and the blanking pulse are separately applied to the input terminals, respectively.

Next, a still further embodiment of this invention will be described with reference to FIG. 3E, FIG. 9 and FIG. 10, in which a composite signal consisting of a PAM-signal and a blanking pulse is applied to a common input terminal.

In this embodiment, the composite signal (FIG. 3E) consisting of the PAM signal (FIG. 3A) and the blanking pulse (FIG. 3B) is applied to the gate electrode 6 and the emitter electrode 8 of the CSJ FET 19 in common. In FIG. 3E, the blanking pulse is positive and the PAM signal is negative. The semiconductor device 1 of FIG. 9 is quite the same as the semiconductor device of FIG. 1, except that the gate electrode 6 and the emitter electrode 8 are connected to the common input terminal 41. Therefore, the parts in FIG. 9 which are in common with the parts in FIG. 1, are denoted by the same reference numerals, which will not be described in detail.

FIG. 10 is a circuit representation of the semiconductor device of FIG. 9. Parts in FIG. 10 which correspond with the parts in FIG. 9, are denoted by the same reference numerals, which will not be described in detail.

Since the composite signal (FIG. 3E) is applied to the gate electrode 6 and the emitter electrode 8 of the CSJ FET 19 through the common input terminal 41, the negative charge is stored in the P-type semiconductive region 3, in correspondence with the voltage of the negative pulse contained in the composite pulse (FIG. 3E). The stored negative charge is neutralized with the holes injected from the P-type semiconductive region 4 due to the positive pulse contained in the composite pulse. Thus, the stored negative charge is blanked. Although the PAM-signal as a sampling pulse and the blanking pulse are contained in one signal, the semiconductor device of FIG. 9 functions substantially in the same manner as the semiconductor device of FIG. 1.

Likewise in the above-mentioned semiconductor devices other than the semiconductor device of FIG. 1, the sampling pulse and the blanking pulse can be contained in one signal. The above-mentioned analog memory circuits using the CSJ FET or charge storage MOS FET can be utilized for a driving circuit of a solid luminous element or a discharging-type display apparatus in order to memorize a video signal for one frame period.

In all of the above-mentioned analog memory circuits, the conductivity type of the semiconductive region may be converted to a reverse conductivity type, where the polarities of the applied signal and the DC power source are reversed. Moreover, in the semiconductor device of FIG. 4, the J-FET as the discharging path for the stored charge may be converted to the MOS FET. And in the semiconductor device of FIG. 7, the MOS FET as the discharging path for the stored charge may be converted to the J-FET.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined in the appended claims.

What is claimed is:
1. An analogue memory circuit comprising,
a substrate of a first conductivity type,
first and second electrodes connected to said substrate and spaced apart to form a current channel therebetween,
a first region of opposite conductivity type formed in said substate between said first and second electrodes and forming a first PN junction,
a second region of first conductivity type formed in said first and forming a second PN junction,
means for applying a signal of a first polarity to said second region so as to forward bias said second PN junction and to reverse bias said first PN junction so that a charge proportional so said input signal is stored in said first region,
means for applying a blanking signal to said memory circuit to neutralize said charge stored in said first region, and
an output terminal connected to said memory circuit to remove a signal proportional to said stored input signal.

2. An analogue memory circuit according to claim 1 wherein said means for applying a blanking signal includes a third region of opposite conductivity type formed in said substrate adjacent to but separated from said first region and said blanking signal applied to said third region.

3. An analogue memory circuit according to claim 2 wherein said substrate, first and second electrodes and said first and second regions comprise a charge storage junction type field effect transistor.

4. An analogue memory circuit according to claim 1 wherein said means for applying a blanking signal includes a third electrode connected to said first region, a field effect transistor having a source, drain and a gate, the source drain current path of said field effect transistor connected to said third electrode and said blanking signal applied to said gate to bias said field effect on and to neutralize said charge stored in said first region.

5. An analogue memory circuit according to claim 4 wherein said drain is connected to said third electrode.

6. An analogue memory circuit according to claim 2 wherein said third region and said second region are electrically connected together and said input signal and said blanking signal are applied to said second and third regions.

7. An analogue memory circuit comprising,
a substrate of a first conductivity type,
first and second spaced regions of opposite conductivity type formed in said substrate,
first and second electrodes spaced apart in said first region,
a third region of first conductivity type formed between said first and second electrodes,
fourth and fifth spaced regions of first conductivity type formed in said second region,
a sixth region of opposite conductivity type formed in said fourth region, said third and sixth regions electrically connected together,
an input signal terminal connected to said sixth region,
a blanking signal terminal connected to said fifth region, and
an output terminal connected to said second electrode.

8. An analogue memory circuit comprising,
a substrate of a first conductivity type,
an insulating layer formed on said substrate,
first and second regions of opposite conductivity type formed in said substrate and spaced from each other,
a first gate electrode formed on said insulating layer between said first and second regions,
a third region of opposite conductivity type formed in said substrate,
a fourth region of first conductivity type formed in said third region,
fifth and sixth regions of opposite conductivity type formed in said substrate and spaced from each other,
a second gate electrode formed on said insulating layer between said fifth and sixth regions,
first, second, third, fourth, fifth and sixth electrodes respectively, connected to said first, second, third, fourth, fifth and sixth regions,
said first gate electrode electrically connected to said fourth and fifth electrodes,
an input signal connected to said third electrode,
a blanking signal connected to said second gate electrode,
an output terminal connected to said second electrode,
said first and sixth electrodes connected together and to a reference point,
an impedance,
a voltage source, and
said impedance connected between said reference point and said output terminal.

* * * * *